(12) United States Patent
Erez et al.

(10) Patent No.: US 10,896,118 B2
(45) Date of Patent: Jan. 19, 2021

(54) DETERMINE SOFT ERROR RESILIENCE WHILE VERIFYING ARCHITECTURAL COMPLIANCE

(71) Applicant: INTERNATIONAL BUSINESS MACHINES CORPORATION, Armonk, NY (US)

(72) Inventors: Ophir Erez, Haifa (IL); Bodo Hoppe, Tamm (DE); Divya K. Joshi, Bangalore (IN); Gerrit Koch, Ammerbuch (DE); Parminder Singh, Bangalore (IN)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/369,107

(22) Filed: Mar. 29, 2019

(65) Prior Publication Data
US 2019/0227906 A1    Jul. 25, 2019

Related U.S. Application Data

(63) Continuation of application No. 15/440,601, filed on Feb. 23, 2017, now Pat. No. 10,318,406.

(51) Int. Cl.
*G06F 11/36* (2006.01)
*G06F 11/26* (2006.01)
(Continued)

(52) U.S. Cl.
CPC ........ *G06F 11/3636* (2013.01); *G06F 11/261* (2013.01); *G06F 30/33* (2020.01); *G06F 11/0778* (2013.01)

(58) Field of Classification Search
CPC ............ G06F 11/3636; G06F 11/3684; G06F 11/3688; G06F 11/3692; G06F 17/5009; G06F 30/33
(Continued)

(56) References Cited

U.S. PATENT DOCUMENTS 5,671,352 A    9/1997  Subrahmaniam et al.
6,006,022 A *  12/1999  Rhim ................. G06F 17/5027
                                                703/26
(Continued)

OTHER PUBLICATIONS

D. Auras, A. Minwegen, U. Deidersen, S. Schurmans, G. Ascheid and R. Leupers, "Just-in-Time Verification in ADL-based processor design," 2012 International Conference on Embedded Computer Systems (SAMOS), Samos, 2012, pp. 1-6. (Year: 2012).*

(Continued)

*Primary Examiner* — Andrew M. Lyons
(74) *Attorney, Agent, or Firm* — Margaret A. McNamara, Esq.; Kevin P. Radigan, Esq.; Heslin Rothenberg Farley & Mesiti P.C.

(57) ABSTRACT

Verifying architectural compliance of a processor core using processor-sparing functions. A simulation of a model for a register-transfer level design of the processor core is performed. A first state of the model is dumped, when no error exists. An error is injected in the model. A second state of the model is dumped, after the injected error is detected in the simulation. Upon dumping the second state, the model is reset and initialized with the first state. State information of the second state is loaded in the reset and initialized model.

20 Claims, 4 Drawing Sheets

(51) Int. Cl.
*G06F 30/33* (2020.01)
*G06F 11/07* (2006.01)

(58) Field of Classification Search
USPC .................................................. 717/124–135
See application file for complete search history.

(56) References Cited

U.S. PATENT DOCUMENTS

| | | | |
|---|---|---|---|
| 6,083,269 A * | 7/2000 | Graef | G06F 17/505 703/14 |
| 6,202,174 B1 * | 3/2001 | Lee | G06F 11/3652 710/266 |
| 6,421,823 B1 | 7/2002 | Heikes | |
| 6,539,503 B1 | 3/2003 | Walker | |
| 7,051,303 B1 * | 5/2006 | Lam | G01R 31/318314 716/106 |
| 7,478,346 B2 * | 1/2009 | Hsu | G06F 17/5022 703/14 |
| 7,962,021 B2 | 6/2011 | Uenaka | |
| 7,966,536 B2 | 6/2011 | Ludewig et al. | |
| 8,073,668 B2 | 12/2011 | Kellington et al. | |
| 8,091,050 B2 | 1/2012 | Bose et al. | |
| 8,365,110 B2 | 1/2013 | Chang et al. | |
| 8,412,981 B2 | 4/2013 | Munoz et al. | |
| 8,413,088 B1 * | 4/2013 | Armbruster | G06F 17/504 716/100 |
| 8,495,344 B2 * | 7/2013 | Henry | G06F 9/3861 712/220 |
| 8,595,680 B1 | 11/2013 | Steinberg | |
| 9,021,409 B2 | 4/2015 | Vasudevan et al. | |
| 9,032,266 B2 * | 5/2015 | Chan | G06F 11/261 714/726 |
| 9,176,837 B2 | 11/2015 | Busaba et al. | |
| 2003/0093254 A1 | 5/2003 | Frankel et al. | |
| 2005/0125754 A1 * | 6/2005 | Schubert | G01R 31/318357 716/102 |
| 2005/0268265 A1 | 12/2005 | Ly et al. | |
| 2007/0050740 A1 | 3/2007 | Jacobi et al. | |
| 2007/0208977 A1 | 9/2007 | Clark et al. | |
| 2007/0294655 A1 | 12/2007 | Campos et al. | |
| 2008/0295043 A1 | 11/2008 | Chang et al. | |
| 2009/0112557 A1 | 4/2009 | King et al. | |
| 2009/0193296 A1 | 7/2009 | Kellington et al. | |
| 2009/0199161 A1 * | 8/2009 | Cutler | G06F 11/366 717/124 |
| 2010/0083203 A1 | 4/2010 | Bose et al. | |
| 2012/0203532 A1 | 8/2012 | Olsen et al. | |
| 2013/0096902 A1 | 4/2013 | Bose et al. | |
| 2013/0110490 A1 * | 5/2013 | Letz | G06F 11/2242 703/21 |
| 2013/0332774 A1 | 12/2013 | Sinanoglu | |
| 2014/0317584 A1 | 10/2014 | Busch | |
| 2015/0127983 A1 * | 5/2015 | Trobough | G06F 11/267 714/30 |
| 2015/0212923 A1 * | 7/2015 | Sugiyama | G06F 11/3644 714/38.1 |
| 2015/0234962 A1 * | 8/2015 | Mazzawi | G06F 30/33 703/14 |
| 2015/0254383 A1 | 9/2015 | Tso-Sheng et al. | |
| 2016/0334467 A1 * | 11/2016 | Cho | G06F 11/261 |
| 2017/0364620 A1 | 12/2017 | Mell | |
| 2018/0004702 A1 | 1/2018 | Pappu et al. | |
| 2018/0239691 A1 | 8/2018 | Ophir et al. | |

OTHER PUBLICATIONS

N. Bombieri, F. Fummi and V. Guarnieri, "Accelerating RTL Fault Simulation through RTL-to-TLM Abstraction," 2011 Sixteenth IEEE European Test Symposium, Trondheim, 2011, pp. 117-122. (Year: 2011).*

Kai-hui Chang, Ilya Wagner, V. Bertacco and I. L. Markov, "Automatic error diagnosis and correction for RTL designs," 2007 IEEE International High Level Design Validation and Test Workshop, Irvine, CA, 2007, pp. 65-72. (Year: 2007).*

Civera, P., Macchiarulo, L., Rebaudengo, M. et al. Journal of Electronic Testing (2002) 18: 261. https://doi.org/10.1023/A:1015079004512 (Year: 2002).*

U. Kühne, S. Beyer, J. Bormann and J. Barstow, "Automated formal verification of processors based on architectural models," Formal Methods in Computer Aided Design, Lugano, 2010, pp. 129-136. (Year: 2010).*

I. Tuzov, J. Ruiz, D. De Andrés and P. Gil, "Speeding-Up Simulation-Based Fault Injection of Complex HDL Models," 2016 Seventh Latin-American Symposium on Dependable Computing (LADC), Cali, 2016, pp. 51-60. (Year: 2016).*

H. Cho, C. Cher, T. Shepherd and S. Mitra, "Understanding soft errors in uncore components," 2015 52nd ACM/EDAC/IEEE Design Automation Conference (DAC), San Francisco, CA, 2015, pp. 1-6, doi: 10.1145/2744769.2744923. (Year: 2015).*

H. Cho, S. Mirkhani, C. Cher, J. A. Abraham and S. Mitra, "Quantitative evaluation of soft error injection techniques for robust system design," 2013 50th ACM/EDAC/IEEE Design Automation Conference (DAC), Austin, TX, 2013, pp. 1-10. (Year: 2013).*

L. Entrena, M. Garcia-Valderas, R. Fernandez-Cardenal, A. Lindoso, M. Portela and C. Lopez-Ongil, "Soft Error Sensitivity Evaluation of Microprocessors by Multilevel Emulation-Based Fault Injection," in IEEE Transactions on Computers, vol. 61, No. 3, pp. 313-322, Mar. 2012, doi: 10.1109/TC.2010.262. (Year: 2012).*

L. Gong and O. Diessel, "ReSim: A reusable library for RTL simulation of dynamic partial reconfiguration," 2011 International Conference on Field-Programmable Technology, New Delhi, 2011, pp. 1-8, doi: 10.1109/FPT.2011.6132709. (Year: 2011).*

D. Kammler, J. Guan, G. Ascheid, R. Leupers and H. Meyr, "A Fast and Flexible Platform for Fault Injection and Evaluation in Verilog-Based Simulations," 2009 Third IEEE International Conference on Secure Software Integration and Reliability Improvement, Shanghai, 2009, pp. 309-314. (Year: 2009).*

D. Mueller-Gritschneder, P. R. Maier, M. Greim and U. Schlichtmann, "System C-based multi-level error injection for the evaluation of fault-tolerant systems," 2014 International Symposium on Integrated Circuits (ISIC), Singapore, 2014, pp. 460-463, doi: 10.1109/ISICIR.2014.7029567. (Year: 2014).*

I. Tuzov, J. Ruiz, D. De Andrés and P. Gil, "Speeding-Up Simulation-Based Fault Injection of Complex HDL Models," 2016 Seventh Latin-American Symposium on Dependable Computing (LADC), Cali, 2016, pp. 51-60, doi: 10.1109/LADC.2016.18. (Year: 2016).*

Conklin, C.R., "Concurrently Update The Scan-Initialization Data of a Processor Core," IBM J. Res. & Dev., vol. 56, No. 1-2, Paper 7, Jan./Mar. 2012, pp. 7:1-7:6.

Thompto, Brian, "Verification for Fault Tolerance of the IBM System z Microprocessor," 2010 47th ACM/IEEE Design Automation Conference (DAC), Jun. 2010, pp. 525-530.

Nguyen, et al. "Chip-level soft error estimation method," in IEEE Transactions on Device and Materials Reliability, vol. 5, No. 3, pp. 365-381, Sep. 2005.

* cited by examiner

DETERMINE SOFT ERROR RESILIENCE WHILE VERIFYING ARCHITECTURAL COMPLIANCE

This application is a continuation of co-pending U.S. patent application Ser. No. 15/440,601, filed Feb. 23, 2017, entitled "DETERMINE SOFT ERROR RESILIENCE WHILE VERIFYING ARCHITECTURAL COMPLIANCE," which is hereby incorporated herein by reference in its entirety.

BACKGROUND

One or more aspects of the present invention relate to processor simulation, and more specifically, to verifying architectural compliance of a processor core using processor-sparing functions of the processor core.

When developing new processor architectures or any other processor containing unit, a design of the new processor core is tested to debug it. This test is performed in a pre-silicon phase and a post-silicon phase. In the pre-silicon phase, the processor is simulated in a simulation environment. For debugging the processor, random errors are injected into a model of the processor. This phase takes a lot of time since many possible errors exist and the model is not always able to correct for the errors by itself. In such a case, the model has to be reset and restarted.

The existing methodology for verifying architectural compliance of the processor core using sparing functions requires a simulated processor core model to recover from any occurred or simulated error. Therefore, several hardware features, i.e. refreshes, error scan logouts and logic resets, need to be stable in order to recover from the injected error before the architectural compliance can be checked. The recovery itself takes many cycles, thus increasing the runtime of the simulation and the time to find a bug and debug it.

SUMMARY

Shortcomings of the prior art are overcome and additional advantages are provided through the provision of a computer program product for verifying architectural compliance of a processor core. The computer program product includes a storage medium readable by a processing circuit and storing instructions for performing a method. The method includes, for instance, performing a simulation of a model for a register-transfer level design of the processor core. A first state of the model is dumped, based on no error existing. An error is injected in the model, and a second state of the model is dumped, based on detecting the error in the simulation. The model is reset and initialized with the first state, based on dumping the second state. State information of the second state is loaded in the reset and initialized model.

Computer-implemented methods and computer systems relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

In the following, embodiments of aspects of the invention are explained in greater detail, by way of example only, making reference to the drawings in which.

DETAILED DESCRIPTION

One or more aspects of the invention provide a method for verifying processor-sparing functions of a processor core. Processor-sparing is the transfer of execution of a function from a first processor core to a second processor core. It is used, for example, when a non-recoverable error occurs in the first processor core suspending execution of the function. The function is transferred to another processor core to continue its execution despite the error in the first processor core.

A transferred function may, for example, be a simulation of a model for a register-transfer level design of a processor core. Processors are usually not designed on a transistor level, but on a more abstract level. Such an abstract level uses combination logic similar to the logic of programming languages, e.g. if-else-operations. This level is called register-transfer level.

Throughout execution of a simulation of the model of a processor, the model goes through different states. Each state represents a snap-shot of the modelled processor at a given cycle, where one or more functions are executed, wherein the cycles are defined by the executing processor's clock signal. The state includes every register of a processor. One part of a state is the architectural state, which contains the control registers and the general purpose registers. The architectural state is the representation of the architecture of an executed function.

When halted, the state of a processor or a model of a processor may be read out and saved. The combined halt, read out and save of a state process is called dumping of a state, where an image of the current state is generated.

To surveil and control the simulation of a processor model, execution of the simulation is accompanied by at least one test bench monitor. Then, the at least one test bench monitor is able to control and observe the internal processes of the modelled processor and to predict a set of upcoming states the processor or the processor model will go through.

Embodiments of the invention may have the beneficial effect that the processor-sparing function can be verified without undergoing recovery of the simulated processor. Therefore, the saved simulation cycles save simulation time and machine resources and may allow an earlier start of further simulations of the processor core.

According to embodiments, the dumping of the first state of the model comprises waiting for a random cycle of the simulation, suspending the performing of the simulation during the dumping of the first state of the model and resuming the performing of the simulation after the dumping of the first state has ended.

These features may allow that an error free dump of the state of the model is saved at a random point in time. The suspension of the performing of the simulation during the dumping may ensure that no register is changed during the read out process. Such a change of one or more registers would result in a corrupted state, which the simulation would not be able to continue from, and thus, would not be able to verify the processor sparing function.

According to embodiments, the dumping of the first state of the model is performed at a random time before the injecting of the error.

This feature may have the beneficial effect that the dumped states of different simulation runs become more diverse. If the simulation is repeated and the first state is dumped at another random point in time for each simulation run, the successful architectural compliance test in the end of the simulation verifies architectural compliance for a random state, and thus, not just for a state, which is dumped at a predefined time.

According to embodiments, a basis for the random time is defined by a set of simulation cycles.

This feature may have the beneficial effect that the dumping of the first state may be performed by a simulation code itself, which counts the cycles of the simulation to trigger the dumping of the first state, wherein the simulation code is the program code containing the instructions for the performing of the simulation. When using the counting of the cycles of the simulation as a trigger for the dumping of the first state, no external time signal is required to trigger the dumping process.

According to embodiments, the random time is a random point in time between two predefined points in time, the points in time being two different points in time.

This feature may have the beneficial effect that the dumping of the first state of at least two different simulation runs may be performed in different time ranges. The likelihood of the first states of at least two different simulation runs being dumped within a same time range after the corresponding simulation has started may be minimized. Thus, using a pair of predefined points in time to limit the time range for the dumping of the first state makes the time range for dumping the first state controllable without losing the effect of dumping the first state randomly.

According to embodiments, the error is a soft error.

This feature may allow an improved control over the injection of the error. A soft error is an undesired change of an instruction of a program being executed within an integrated logic circuit caused by any stochastically occurred error sources, e.g., cosmic radiation, radioactivity, disturb signals or any kind of white and red noise. A soft error does not damage the hardware of a software performing system but it damages the data being computed. That is why a soft error and the lowered reliability of the executing system are unnoticed until the damaged data is detected, in which case it is too late to prevent the damage. For this reason, the injecting of a soft error is simulated. Since the soft error is an undesired change of an instruction, it is possible to change an instruction manually and under simulated testing conditions at any desired time. Being able to inject the soft error manually under predefined conditions saves simulation cycles, and therefore, time by controlling which instruction is changed. For example, a register containing a corrupted instruction may be known, if the injecting of the error is controlled. Therefore, by controlling the injecting of the soft error, the register containing the corrupted instruction does not have to be searched. Thus, the controlled injecting of the error is faster than finding a randomly injected error.

According to embodiments, the injecting of the error is performed at a random point in time while the simulation is performed.

This feature may have the beneficial effect that it is unknown in which cycle the error is injected. In reality, the point in time when a real error occurs in a real processor, the error may occur at any time. Thus, the injecting of the error at a random point in time converges the simulated condition to a real condition.

According to embodiments, the dumping of the first state is performed in response to starting the performing of the simulation.

This feature may have the beneficial effect that the dumped first state of the model is dumped as early as possible. Therefore, it differs the most from the second state. For larger differences between the first and the second state, the successful verification of processor-sparing functions shows larger potency of selecting the first state, and thus, showing the independence of the verifying the processor-sparing function from the exact architecture of the first state.

According to embodiments, the resetting and the initializing of the model comprises reloading the first state and synchronizing the model with the first state.

This feature may allow that a state with no error condition is loaded and the model is synchronized with that error free condition. Thus, the first state of the model forms the basis for the loading the state information of the second state.

According to embodiments, the loaded state information of the second state of the model is an architectural state of the model.

This feature may have the beneficial effect that the simulation can be resumed, where it has stopped when the error was detected. The architectural state is information for the processor to continue executing the simulation comprising the control registers and the general purpose registers, which form the state of a process. The loading of the architectural state of the second state comprises loading the information to continue the simulation from the second state but without the injected error.

According to embodiments, the method further comprises resuming the simulation from the second state of the model after loading the second state.

This feature may have the beneficial effect that the simulation of the model may be finished to check for further errors and/or if the injected error is still present in the simulation.

According to embodiments, the method further comprises performing an architectural compliance check after the performing of the simulation has ended.

These features may allow the verification of the processor-sparing function by checking the architectural compliance of the model. If the architectural compliance is correct, no error is detected. The architectural state of the simulated model may then be compared to an expected or predicted architectural state of the model. If the comparison results in two identical architectural states, the processor-sparing function is verified. If the comparison results in two different architectural states, the processor-sparing function is not verified.

According to embodiments, the method is monitored by at least one test bench monitor, and the test bench monitor is turned off when performing the injecting of the error into the model and re-enabled after the resetting and the initializing of the model.

These features may have the beneficial effect that the at least one test bench monitor is able to control and surveil the simulation. With the surveillance of the simulation on the first hand, a computer engineer developing a processor may be able to get information about the simulation while the simulation is running. On the other hand, the engineer may be able to manipulate the simulation by adding desired changes, choosing the error which will be injected, or form any appropriate condition.

Because the at least one test bench monitor may not be able to handle every possible error injected into the simulation, the at least one test bench monitor is turned off in the moment of the injecting of the error. When the error is detected and the model is reset and initialized with the first state, the at least one test bench monitor may be re-enabled. Because the dumping of the first state is performed before the injecting of the error and the at least one test bench monitor is re-enabled after the reloading of the first state, the test bench monitor does not get into a situation, where it would have to deal with the error. Thus, the test bench monitor avoids the risk of facing an error that the test bench monitor is not able to handle.

According to embodiments, the re-enabling of the at least one test bench monitor comprises a synchronization of the test bench monitor with the simulation of the model.

This feature may allow that the at least one test bench monitor be able to continue controlling and surveilling the loaded states instead of being synchronized with the state at the exact moment, when the at least one test bench monitor was turned off, and therefore, not synchronized with the actual simulation.

Figure 1:
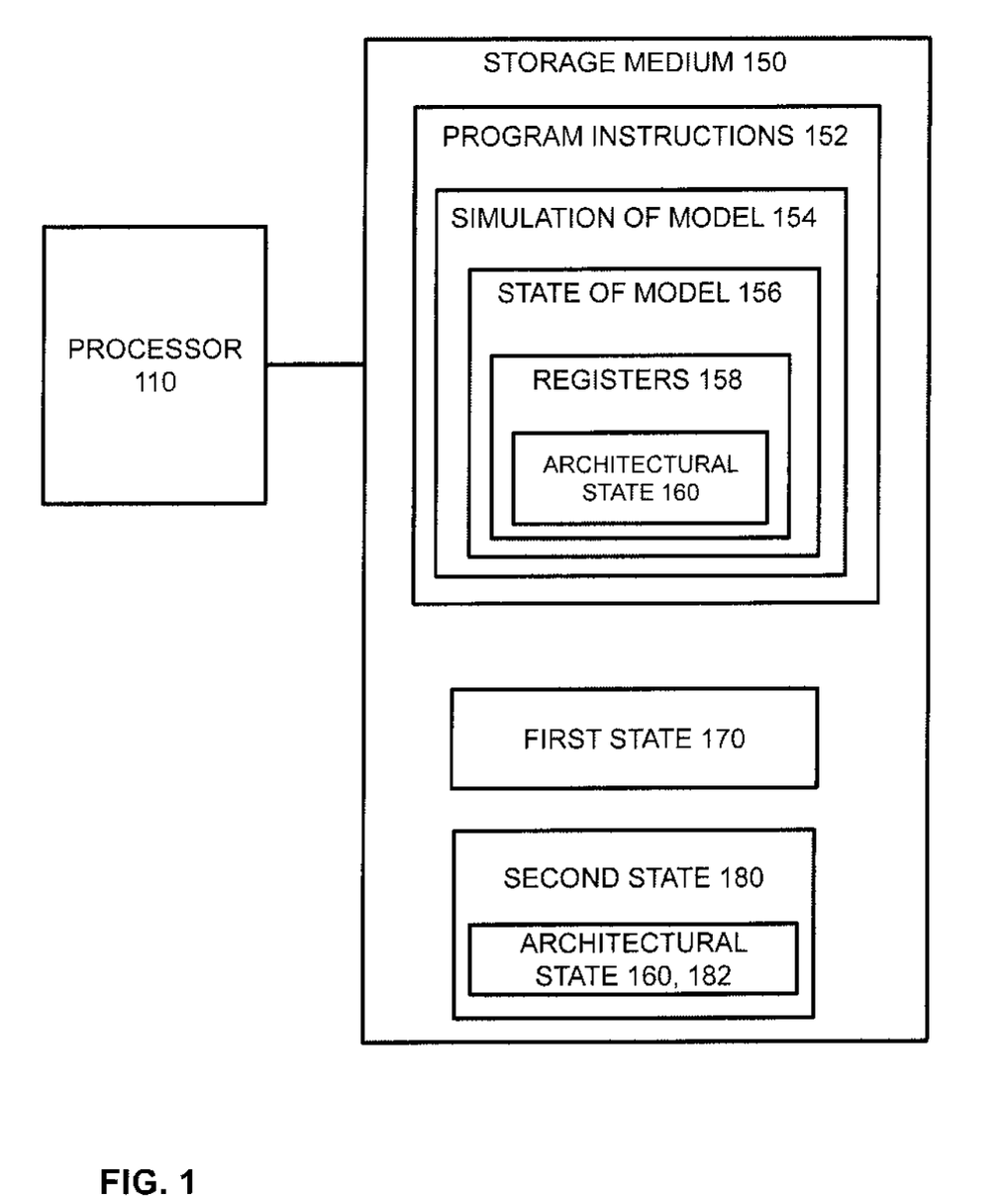
FIG. 1 depicts one example of a system for executing a simulation of a model for register-transfer level design of a processor core, in accordance with an aspect of the present invention.

FIG. 1 depicts one example of a system for executing a simulation of a register-transfer level design of a processor core. The depicted system comprises a processor 110 configured to execute program instructions 152, wherein the program instructions 152 are stored in a storage medium 150. The processor 110 may be a multi- or single core processor and/or may have one or more co-processors. The processor is communicatively coupled to the storage medium 150. The storage medium 150 may be a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The program instructions 152 contain the instructions for executing the simulation of a model 154 for a register-transfer level design of a processor core. During the simulation of the model 154, the model goes through different states of the model 156. Those states may be dumped as a first state 170, a second state 180 and a desired number of additional states. The state of the model contains every register 158 of the model. The architectural state 160 of the model is a part of the registers 158, and therefore, contained by the state of the model 156. When the second state 180 is dumped, the saved architectural state 182 and the architectural state 160 of the model are identical. In every other cycle of the simulation, the architectural state 160 of the model and the architectural state 182 of the second state may be different.

During the simulation of the model 154, the dumping of the states is ordered in time. The first state is dumped at first. The second state is dumped after an injected error was detected by the model, wherein the error was injected after the first state has been dumped.

Figure 2:
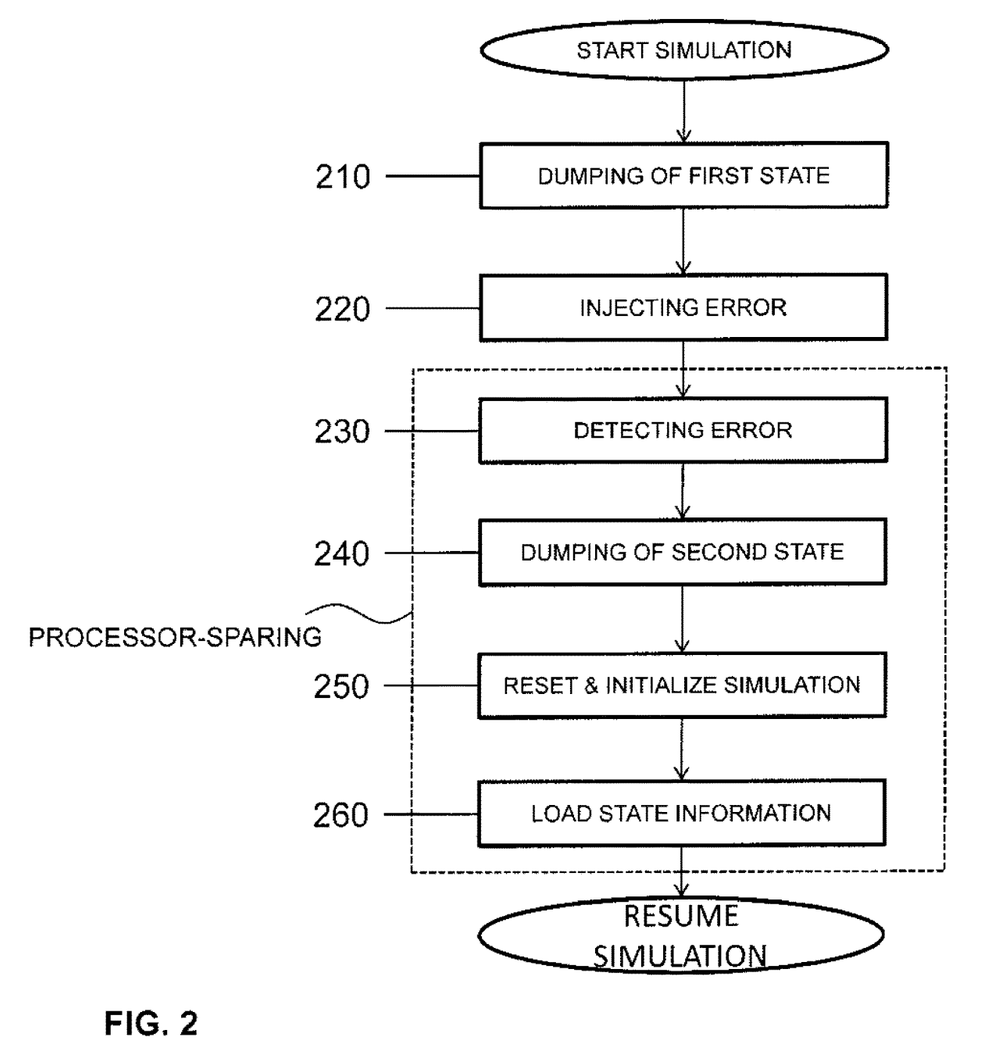
FIG. 2 depicts one example of a flow diagram of a method for verifying processor-sparing functions, in accordance with an aspect of the present invention.

FIG. 2 depicts one example of a flow diagram of a method for verifying architectural compliance using processor-sparing functions. The method starts, for instance, with the state of a simulation of a model for a register-transfer level design of a processor core. At a certain point in time, a dumping of a first state 210 is performed while no error exists in the model. The point in time for dumping the first state 210 may be the point in time right after the execution of the simulation has started, a random point in time or predefined by a period, wherein the period may be a certain amount of time or a predefined amount of simulation cycles. The length of the period may be chosen depending on the simulation of the model. If the dumping of the first state 210 executes too often, it may generate too many dumped states, and therefore, the required storage may increase. The required storage may be kept low by deleting selected versions of the first state, but then, the ability to reload any of the first states during one of the upcoming processes is lost. Therefore, the flexibility of choosing one of the dumped first states of the method is reduced.

After the dumping of the first state 210, the injecting of an error 220 into the model is performed. The error may be injected at a random point in time or at a predefined point in time. The error may be a soft-error, which is an unexpected and/or undesired change of an instruction within one of the registers. A soft-error is not capable of damaging an executing hardware system but the computed data may become corrupted, and therefore, damaged and lost. The injecting of the error 220 may be performed in the same cycle as the dumping of the first state 210, but after the dumping of the first state 210 is completed.

When the injecting of the error 220 is performed, the execution of the simulation is continued until the injected error is detected 230. With the detecting of the error 230, the performing of the processor-sparing starts. After the detection of the error 230, a dumping of a second state 240 is performed. Then, a resetting and initializing of the simulation 250 is performed. During the resetting and initializing, the first state is loaded into the model and the model is synchronized with the first state. After the resetting and initializing of the model 250 with the first state is performed, a loading of state information 260 of the second state into the model is performed. The state information may be an architectural state of the second state. The loading of the state information 260 into the model completes the processor-sparing. When the processor-sparing is completed, the simulation may be resumed from the cycle in which the error was detected.

Figure 3:
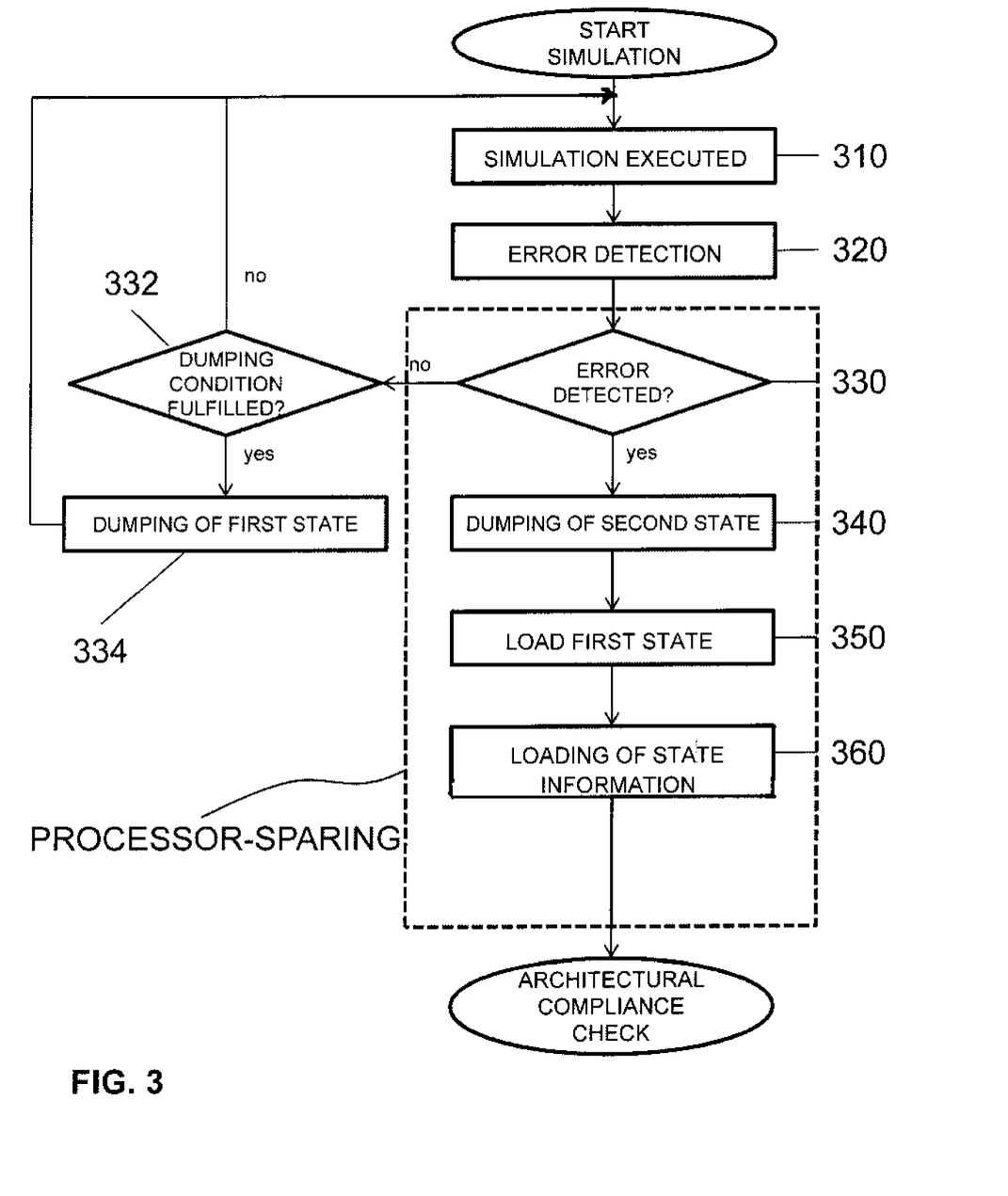
FIG. 3 depicts one example of a flow diagram of a simulation of a model for register-transfer level design of a processor core, in accordance with an aspect of the present invention.

FIG. 3 depicts one example of a flow diagram of a simulation of a model for register-transfer level design of a processor core. After the simulation has started, the simulation is executed 310. During the execution of the simulation 310, the model is searched for errors by performing instructions for error detection 320. The error detection 320 may result in two options 330.

The first option is the result of no error was found. The simulation then checks if a dumping condition is fulfilled 332. A dumping condition may depend on a predefined period of time or simulation cycles or a point in time chosen randomly. It may further contain a present instruction containing a calling for a dumping of a first state. The instruction may be injected into an instruction queue of the model or may be a part of the simulation code. If the dumping condition is unfulfilled, the execution of the simulation 310 is continued. If the dumping condition is fulfilled, the dumping of the first state 334 is performed. After the completion of the dumping of the first state 334, the execution of the simulation 310 is continued. In both cases, the execution of the simulation 310 is continued until an error is detected 330 during the error detection 320.

The second option is that the error detection 320 results in a detected error 330, which initiates the process of processor-sparing. After the error is detected, a dumping of a second state 340 is performed. When the dumping of the second state 340 is completed, the simulation loads the first state 350 and, by performing the loading of the first state 350, resetting and initializing the model with the first state. After completion of the resetting and initializing the model, a loading of state information of the second state 360 is performed. The state information may be an architectural state of the second state. The loading of the state information 360 into the model completes the processor-sparing.

When the processor-sparing is completed, the simulation is resumed from the cycle in which the error was detected. After the execution of the simulation has ended, an architectural compliance check is performed. The architectural compliance check indicates a correct processor-sparing function. If the architectural compliance is confirmed by the architectural compliance check, the architectural state of the simulated model may be compared to a predicted architectural state of the simulated model. If the comparison results in two identical architectural states, the processor-sparing function is verified.

Figure 4:
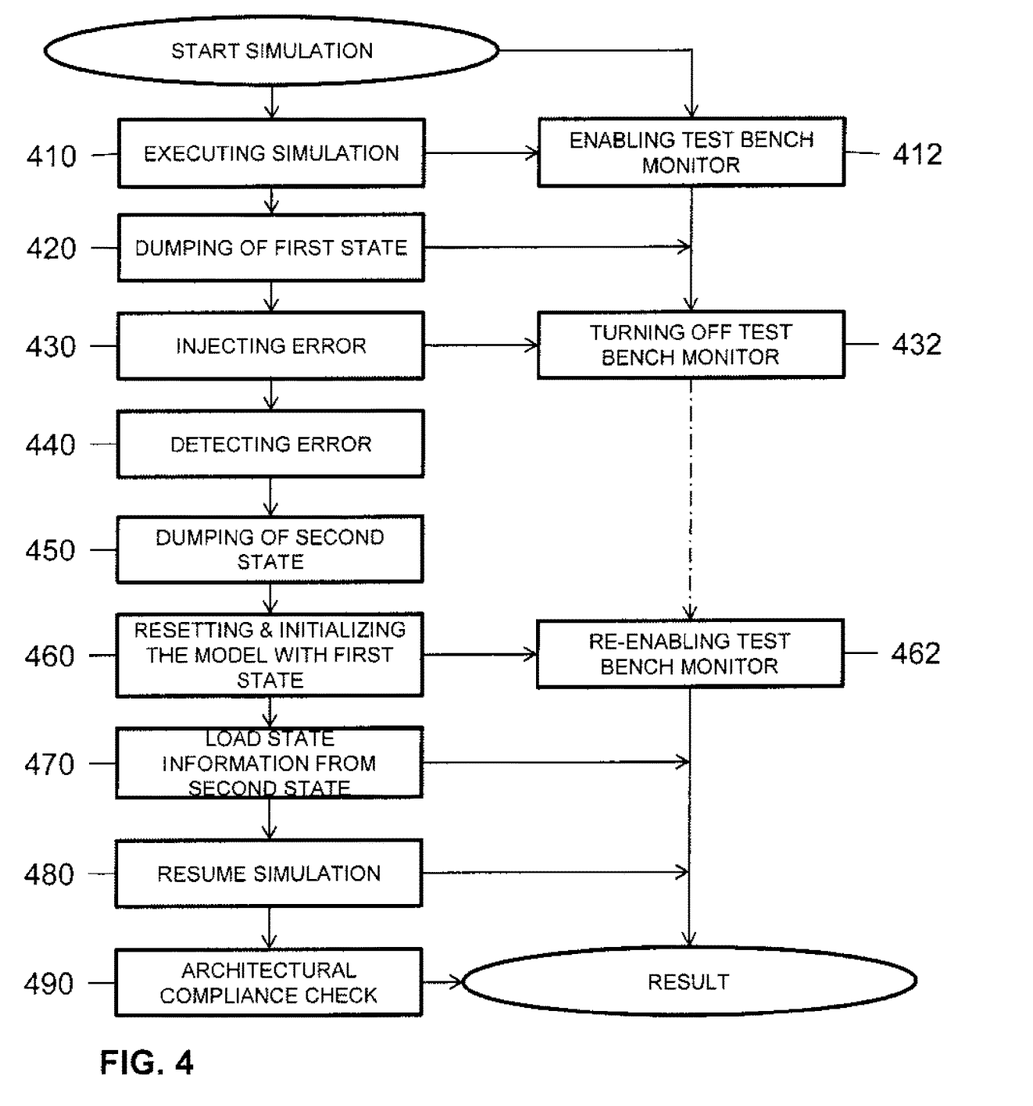
FIG. 4 depicts one example of a flow diagram of a use of a test bench monitor during an execution of a method for verifying processor-sparing functions, in accordance with an aspect of the present invention.

FIG. 4 depicts one example of a flow diagram of a method for verifying processor-sparing functions of a processor core and its execution in combination with at least one test bench monitor. For simplicity, this figure is described with the usage of one test bench monitor, but further test bench monitors may be used to surveil and control the simulation. A start of a simulation initializes the execution of the simulation 410 and the enabling of the test bench monitor 412.

The test bench monitor permanently receives information about the executed simulation. During the execution of the simulation 410, a first state is dumped 420. This process is also surveilled by the test bench monitor. The dumping of the first state may be controlled by the test bench monitor by sending a calling for the dumping of the first state 420. After the dumping of the first state 420 is completed, an error is injected 430 into the model. In response to the injecting of the error 430, the test bench monitor is turned off 432. While it is turned off, the risk of facing an error, which cannot be handled by the test bench monitor is avoided. The detection of the error 440 and the dumping of the second state 450 are performed without the test bench monitor being enabled.

When the resetting and initializing of the model with the first state 460 is performed, the test bench monitor is re-enabled 462. The re-enabling of the test bench monitor may be performed prior to, in response to or during the resetting and initializing of the model with the first state 460. The loading of state information of the second state 470 and the resuming of the simulation 480 are surveilled and controlled by the re-enabled test bench monitor. When the simulation is completed, an architectural compliance check is performed 490. The result may be evaluated by the test bench monitor, which compares the architectural state of the finished simulation with a predicted architectural state. The prediction may be performed by the test bench monitor.

As described herein, one aspect of the invention relates to a computer-implemented method for verifying architectural compliance of the processor using processor-sparing functions of a processor core comprising performing a simulation of a model for a register-transfer level design of the processor core, dumping a first state of the model, when no error exists, injecting an error in the model, dumping a second state of the model, after the injected error is detected in the simulation, and upon dumping the second state, resetting and initializing the model with the first state and loading state information of the second state in the reset and initialized model.

A further aspect of the invention relates to a computer program product for verifying processor-sparing functions of a processor core comprising performing a simulation of a model for a register-transfer level design of the processor core, dumping a first state of the model, when no error exists, injecting an error in the model, dumping a second state of the model, after the injected error is detected in the simulation, and upon dumping the second state, resetting and initializing the model with the first state and loading state information of the second state in the reset and initialized model.

A further aspect of the invention relates to a computer system for verifying processor-sparing functions of a processor core comprising performing a simulation of a model for a register-transfer level design of the processor core, dumping a first state of the model, when no error exists, injecting an error in the model, dumping a second state of the model, after the injected error is detected in the simulation, and upon dumping the second state, resetting and initializing the model with the first state and loading state information of the second state in the reset and initialized model.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for verifying architectural compliance of a processor core, the computer program product comprising:
   a computer readable storage medium readable by a processing circuit and storing instructions for performing a method comprising:
   performing a simulation of a model for a register-transfer level design of the processor core;
   during execution of the simulation, searching the model for an error;
   based on no error being detected during the searching, determining whether a dumping condition has been fulfilled;
   based on no error being detected during the searching and on determining that the dumping condition has been fulfilled, dumping a first state of said model;
   based on completing dumping the first state of the model, injecting an error in said model;
   based on injecting the error in the model, continuing with execution of the simulation until detecting the error in the simulation, and responsive to detecting the error in the simulation, performing processor-sparing by:
   dumping a second state of said model;
   responsive to dumping the second state, resetting and initializing said model with the first state; and
   responsive to resetting and initializing said model with the first state, loading state information of the second state in the reset and initialized model.

2. The computer program product of claim 1, wherein the dumping condition for dumping the first state of the model comprises waiting for a random cycle of the simulation, and the dumping comprises:
   suspending the performing the simulation during the dumping the first state of the model; and
   resuming the performing the simulation after the dumping the first state has ended.

3. The computer program product of claim 1, wherein the dumping condition for dumping the first state of the model is a random time before the injecting the error.

4. The computer program product of claim 3, wherein a basis of the random time is defined by a set of simulation cycles.

5. The computer program product of claim 3, wherein the random time is a random point in time between two predefined points in time, the two predefined points in time being two different points in time.

6. The computer program product of claim 1, wherein searching comprises executing instructions for error detection, and wherein the error is a soft error.

7. The computer program product of claim 1, wherein the injecting the error is performed at a random point in time while the simulation is performed.

8. The computer program product of claim 1, wherein the dumping the first state is based on starting the performing the simulation.

9. The computer program product of claim 1, wherein the resetting and initializing the model comprises reloading the first state and synchronizing the model with the first state.

10. The computer program product of claim 1, wherein the state information of the second state is an architectural state of the model.

11. The computer program product of claim 1, wherein the method further comprises resuming the simulation from the second state of the model based on loading the state information of the second state.

12. The computer program product of claim 11, wherein the method further comprises performing an architectural compliance check after the simulation has ended, wherein a successful architectural compliance check indicates a successful processor-sparing function of the processor core.

13. The computer program product of claim 1, wherein the simulation of the model is monitored by at least one test bench monitor, wherein the at least one test bench monitor is turned off based on performing the injecting the error into the model and re-enabled based on the resetting and initializing of the model.

14. The computer program product of claim 13, wherein the re-enabling the at least one test bench monitor comprises synchronizing the at least one test bench monitor with the simulation of said model.

15. A computer system for verifying architectural compliance of a processor core, the computer system comprising:
   memory; and
   a processor in communication with the memory, wherein the computer system is configured to perform a method, said method comprising:
      performing a simulation of a model for a register-transfer level design of the processor core;
      during execution of the simulation, searching the model for an error;
      based on no error being detected during the searching, determining whether a dumping condition has been fulfilled;
      based on no error being detected during the searching and on determining that the dumping condition has been fulfilled, dumping a first state of said model;
      based on completing dumping the first state of the model, injecting an error in said model;
      based on injecting the error in the model, continuing with execution of the simulation until detecting the error in the simulation, and responsive to detecting the error in the simulation, performing processor-sparing by:
         dumping a second state of said model;
         responsive to dumping the second state, resetting and initializing said model with the first state; and
         responsive to resetting and initializing said model with the first state, loading state information of the second state in the reset and initialized model.

16. The computer system of claim 15, wherein the method further comprises resuming the simulation from the second state of the model based on loading the state information of the second state.

17. The computer system of claim 15, wherein the method further comprises performing an architectural compliance check after the simulation has ended, wherein a successful architectural compliance check indicates a successful processor-sparing function of the processor core.

18. A computer-implemented method of verifying architectural compliance of a processor core, the computer-implemented method comprising:
   performing a simulation of a model for a register-transfer level design of the processor core;
   during execution of the simulation, searching the model for an error;
   based on no error being detected during the searching, determining whether a dumping condition has been fulfilled;
   based on no error being detected during the searching and on determining that the dumping condition has been fulfilled, dumping a first state of said model;
   based on completing dumping the first state of the model, injecting an error in said model;
   based on injecting the error in the model, continuing with execution of the simulation until detecting the error in the simulation, and responsive to detecting the error in the simulation, performing processor-sparing by:
      dumping a second state of said model;
      responsive to dumping the second state, resetting and initializing said model with the first state; and
      responsive to resetting and initializing said model with the first state, loading state information of the second state in the reset and initialized model.

19. The computer-implemented method of claim 18, further comprising resuming the simulation from the second state of the model based on loading the state information of the second state.

20. The computer-implemented method of claim 18, further comprising performing an architectural compliance check after the simulation has ended, wherein a successful architectural compliance check indicates a successful processor-sparing function of the processor core.

* * * * *